United States Patent
Chen et al.

(10) Patent No.: US 12,550,701 B2
(45) Date of Patent: Feb. 10, 2026

(54) FORMATION METHOD OF SEMICONDUCTOR DEVICE WITH STACKED CONDUCTIVE STRUCTURES

(71) Applicant: Taiwan Semiconductor Manufacturing Company, Ltd., Hsinchu (TW)

(72) Inventors: Chun-Yuan Chen, HsinChu (TW); Chia-Hao Chang, Hsinchu (TW); Cheng-Chi Chuang, New Taipei (TW); Yu-Ming Lin, Hsinchu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 228 days.

(21) Appl. No.: 18/053,016

(22) Filed: Nov. 7, 2022

(65) Prior Publication Data
US 2023/0207383 A1    Jun. 29, 2023

Related U.S. Application Data

(62) Division of application No. 16/744,503, filed on Jan. 16, 2020, now Pat. No. 11,495,491.

(51) Int. Cl.
*H01L 21/768*      (2006.01)
*H01L 23/522*      (2006.01)
*H01L 23/532*      (2006.01)

(52) U.S. Cl.
CPC .. *H01L 21/76816* (2013.01); *H01L 21/76829* (2013.01); *H01L 21/76877* (2013.01); *H01L 23/5226* (2013.01); *H01L 23/53209* (2013.01)

(58) Field of Classification Search
CPC ........ H01L 21/76816; H01L 21/76829; H01L 21/76877; H01L 23/5226; H01L 23/53209; H01L 21/76804; H01L 21/76805; H01L 23/53252; H01L 21/76843
See application file for complete search history.

(56) References Cited

U.S. PATENT DOCUMENTS

| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |

(Continued)

OTHER PUBLICATIONS

U.S. Appl. No. 16/572,812, filed Sep. 17, 2019.

*Primary Examiner* — Thanhha S Pham
(74) *Attorney, Agent, or Firm* — McClure, Qualey & Rodack, LLP

(57) ABSTRACT

A method for forming a semiconductor device structure is provided. The method includes forming a first conductive structure surrounded by a first dielectric layer and forming a second dielectric layer over the first conductive structure and the first dielectric layer. The method also includes forming a via hole in the second dielectric layer, and the via hole exposes the first conductive structure. The method further includes partially removing the first conductive structure through the via hole to form a recess in the first conductive structure. In addition, the method includes forming a second conductive structure filling the recess and the via hole.

20 Claims, 13 Drawing Sheets

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2006/0223325 A1 | 10/2006 | Hamada et al. |
| 2008/0026564 A1* | 1/2008 | Frohberg .......... H01L 21/76847 |
| | | 438/637 |
| 2008/0122090 A1* | 5/2008 | Hsu .................. H01L 21/76805 |
| | | 257/776 |
| 2015/0364581 A1 | 12/2015 | Chen et al. |
| 2016/0233164 A1* | 8/2016 | Choi .................... H10D 62/822 |
| 2019/0355663 A1* | 11/2019 | Nishikawa ........ H01L 21/76847 |

* cited by examiner

FORMATION METHOD OF SEMICONDUCTOR DEVICE WITH STACKED CONDUCTIVE STRUCTURES

PRIORITY CLAIM AND CROSS-REFERENCE

This Application is a Divisional of U.S. application Ser. No. 16/744,503, filed on Jan. 16, 2020, now U.S. Pat. No. 11,495,491, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
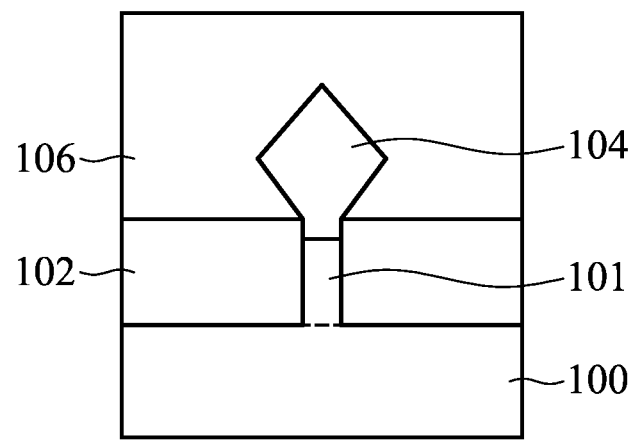
FIGS. 1A-1H are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or "substantially coplanar", etc., will be understood by a person skilled in the art. In some embodiments, the adjective "substantially" may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x ±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

FIGS. 1A-1H are cross-sectional views of various stages of a process for forming a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or another elementary semiconductor material such as germanium. The semiconductor substrate 100 may be un-doped or doped (such as p-type, n-type, or a combination thereof). In some embodiments, portions of the semiconductor substrate 100 are doped with dopants to form well regions. Multiple ion implantation processes may be used to form the well regions. In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

Afterwards, patterned mask elements (not shown) are formed over the semiconductor substrate 100 to assist in a subsequent formation of semiconductor fins, in accordance with some embodiments. One or more etching processes may be used to partially remove the semiconductor substrate 100. As a result, multiple recesses are formed in the semiconductor substrate 100. Multiple semiconductor fins are defined between these recesses. In FIG. 1A, one of the semiconductor fins (i.e., the semiconductor fin 101) is shown.

Afterwards, isolation features 102 are formed over the semiconductor substrate 100, as shown in FIG. 1A in accordance with some embodiments. In some embodiments, a dielectric material layer is deposited over the semiconductor substrate 100 to cover and surround the semiconductor fins 101. The dielectric material layer may be made of or include silicon oxide, silicon nitride, silicon oxynitride, fluorinated silicate glass (FSG), low-K dielectric material, one or more other suitable materials, or a combination thereof. The dielectric material layer may be deposited using an atomic layer deposition (ALD) process, a chemical vapor deposition (CVD) process, a physical vapor deposition (PVD) process, a spin-on process, one or more other applicable processes, or a combination thereof.

A planarization process is then used to thin the dielectric material layer until the semiconductor fins 101 or the mask elements used for defining the semiconductor fins 101 are exposed. The planarization process may include a chemical mechanical polishing (CMP) process, a grinding process, a dry polishing process, an etching process, one or more other applicable processes, or a combination thereof.

Afterwards, the mask elements used for defining the semiconductor fins 101 are removed, and the dielectric material layer is partially removed, in accordance with some embodiments. For example, the dielectric material layer is etched back. As a result, the remaining portions of the dielectric material layer form the isolation features 102, as shown in FIG. 1A.

After subsequent processes for forming one or more gate stacks (such as dummy gate stacks), multiple epitaxial structures (including an epitaxial structure 104) are formed. The epitaxial structure 104 is formed over the semiconductor fin 101, as shown in FIG. 1A in accordance with some embodiments. The epitaxial structure 104 may function as a source/drain structure. In some embodiments, the semiconductor fin 101 is recessed to a level below the top surfaces of the isolation features 102. Afterwards, one or more semiconductor materials are epitaxially grown over the semiconductor fin 101 to form the epitaxial structure 104.

The epitaxial structure 104 may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, an ALD process, one or more other applicable processes, or a combination thereof.

In some embodiments, the epitaxial structure 104 is doped with one or more suitable dopants. For example, the epitaxial structure 104 is doped with boron (B), indium (In), or another suitable dopant. Alternatively, in some other embodiments, the epitaxial structure 104 is doped with phosphor (P), antimony (Sb), or another suitable dopant.

In some embodiments, the epitaxial structure 104 is doped in-situ during the growth of the epitaxial structure 104. In some other embodiments, the epitaxial structure 104 is not doped during the growth of the epitaxial structure 104. Instead, after the formation of the epitaxial structure 104, the epitaxial structure 104 is doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structure 104 is further exposed to one or more annealing processes to activate the dopants. For example, a rapid thermal annealing process is used.

Afterwards, a dielectric layer 106 is deposited over the epitaxial structure 104 and the isolation features 102, as shown in FIG. 1A in accordance with some embodiments. The dielectric layer 106 may be made of or include carbon-containing silicon oxide, silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. In some embodiments, the dielectric layer 106 is deposited using a FCVD process, a CVD process, an ALD process, a PECVD process, a spin coating process, one or more other applicable processes, or a combination thereof.

In some embodiments, the formation of the dielectric layer 106 further includes a planarization process which is used to provide the dielectric layer 106 with a substantially planar top surface. The planarization process may include a CMP process, an etching process, a grinding process, a dry polishing process, one or more other applicable processes, or a combination thereof.

Many variations and/or modifications can be made to embodiments of the disclosure. In some embodiments, an etch stop layer is deposited over the epitaxial structure 104 and the isolation features 102 before the formation of the dielectric layer 106. The etch stop layer may be made of or include silicon nitride, silicon oxynitride, silicon carbide, carbon-containing silicon oxide, carbon-containing silicon nitride, carbon-containing silicon oxynitride, metal oxide, metal nitride, metal oxynitride, carbon-containing metal oxide, carbon-containing metal nitride, carbon-containing metal oxynitride, one or more other suitable materials, or a combination thereof. The etch stop layer may be deposited using a CVD process, an ALD process, a PVD process, one or more other applicable processes, or a combination thereof.

Afterwards, a gate replacement process may be used to replace the previously formed gate stacks (such as dummy gate stacks) with new gate stacks (such as metal gate stacks).

Figure 1B:
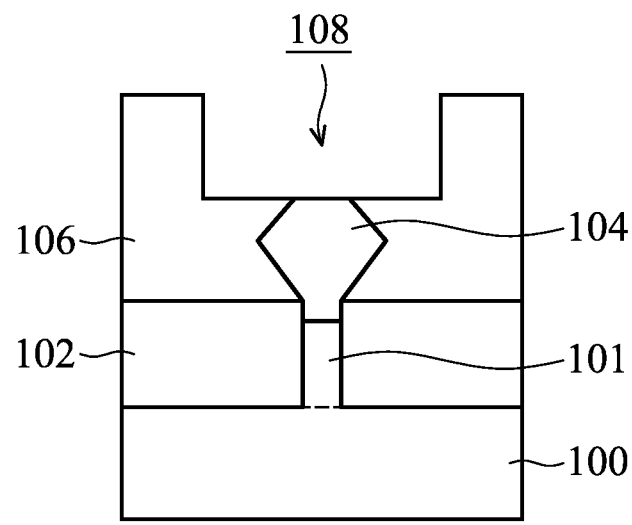

As shown in FIG. 1B, the dielectric layer 106 is partially removed to form an opening 108, in accordance with some embodiments. The opening 108 may function as a contact opening that exposes the epitaxial structure 104. The epitaxial structure 104 may be partially removed during the formation of the opening 108. The opening 108 may be formed using one or more etching processes. In some embodiments, the opening 108 is formed using a self-aligned etching process in which no additional mask is used. In some other embodiments, a patterned mask is used to assist in the formation of the opening 108.

Figure 1C:
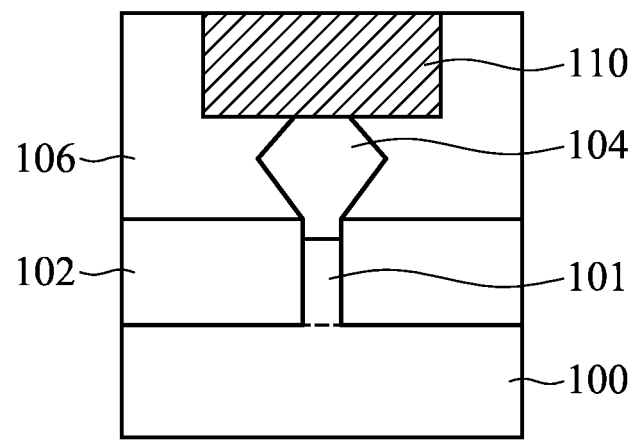

As shown in FIG. 1C, a conductive structure 110 is formed in the opening 108, in accordance with some embodiments. The conductive structure 110 may function as a conductive contact that provides electrical connection to the epitaxial structure 104. The conductive structure 110 may be made of or include cobalt (Co), ruthenium (Ru), tungsten (W), molybdenum (Mo), aluminum (Al), or a combination thereof. The thickness of the conductive structure 110 may be in a range from about 3 nm to about 100 nm.

In some embodiments, a conductive material layer used for forming the conductive structure 110 is deposited over the dielectric layer 106 to overfill the opening 108. The conductive material layer may be deposited using a CVD process, an ALD process, a PVD process, an electrochemical plating process, one or more other applicable processes, or a combination thereof. Afterwards, a planarization process may be used to remove the portion of the conductive material layer outside of the opening 108. The planarization process may include a CMP process, an etching process, a grinding process, a dry polishing process, one or more other applicable processes, or a combination thereof. As a result, the remaining portion of the conductive material layer in the opening 108 forms the conductive structure 110.

Figure 1D:
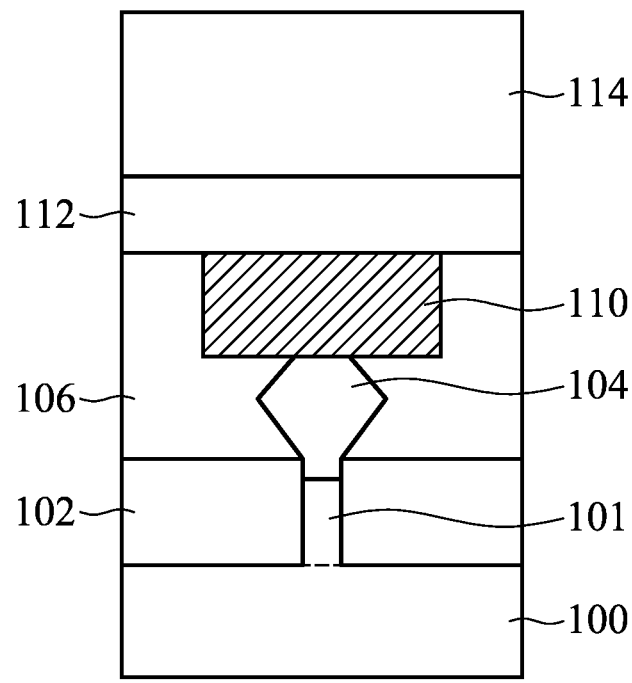

As shown in FIG. 1D, an etch stop layer 112 is deposited over the dielectric layer 106 and the conductive structure 110, in accordance with some embodiments. The etch stop layer 112 may be a single layer. Alternatively, the etch stop layer 112 may be have multiple sub-layers. The thickness of the etch stop layer 112 may be in a range from about 1 nm to about 30 nm.

The etch stop layer 112 may be made of or includes silicon nitride, silicon oxynitride, silicon carbide, carbon-containing silicon oxide, carbon-containing silicon nitride, carbon-containing silicon oxynitride, metal oxide (such as aluminum oxide and/or zirconium oxide), metal nitride (such as aluminum nitride), metal oxynitride (such as aluminum oxynitride), carbon-containing metal oxide, carbon-containing metal nitride, carbon-containing metal oxynitride, one or more other suitable materials, or a combination thereof. The etch stop layer 112 may be deposited using a CVD process, an ALD process, a PVD process, one or more other applicable processes, or a combination thereof.

Afterwards, a dielectric layer 114 is deposited over the etch stop layer 112, as shown in FIG. 1D in accordance with some embodiments. The thickness of the dielectric layer 114 may be in a range from about 5 nm to about 40 nm. The dielectric layer 114 may be made of or include carbon-containing silicon oxide, silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. In some embodiments, the dielectric layer 114 is deposited using a FCVD process, a CVD process, an ALD process, a PECVD process, a spin coating process, one or more other applicable processes, or a combination thereof.

In some embodiments, the formation of the dielectric layer 114 further includes a planarization process which is used to provide the dielectric layer 114 with a substantially planar top surface. The planarization process may include a CMP process, an etching process, a grinding process, a dry polishing process, one or more other applicable processes, or a combination thereof.

Many variations and/or modifications can be made to embodiments of the disclosure. In some embodiments, the etch stop layer 112 is not formed. In these cases, the dielectric layer 114 may be deposited directly on the dielectric layer 106 and the conductive structure 110.

Figure 1E:
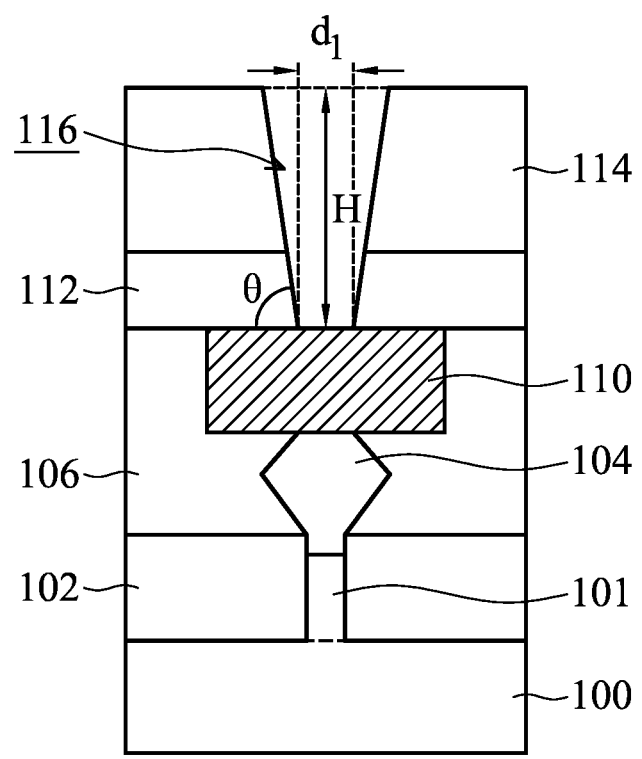

As shown in FIG. 1E, the dielectric layer 114 is partially removed to form a via hole 116, in accordance with some embodiments. The via hole 116 may partially expose the etch stop layer 112. Afterwards, the etch stop layer 112 may be partially removed. As a result, the via hole 116 extends downwards to partially expose the conductive structure 110, as shown in FIG. 1E. The formation of the via hole 116 may involve a photolithography process and an etching process.

As shown in FIG. 1E, the via hole has a depth H and a bottom width di. The depth H may be in a range from about 5 nm to about 40 nm. The bottom width di may be in a range from about 3 nm to about 25 nm.

FIGS. 2A-2D are cross-sectional views of various stages of a process for forming a semiconductor device structure, in accordance with some embodiments. In some embodiments, the cross-sectional views in FIGS. 2A-2D and the cross-sectional views in FIGS. 1A-1H are taken along two cut lines that are perpendicular to each other. For example, FIGS. 2A-2D are X-cut cross-sectional views, and FIGS. 1A-1H are Y-cut cross-sectional views. In some embodiments, FIG. 2A partially shows the structure shown in FIG. 1E. For simplicity, the elements under the bottom surface of the conductive structure 110 are only shown in FIG. 1E but not shown in FIG. 2A.

Figure 2A:
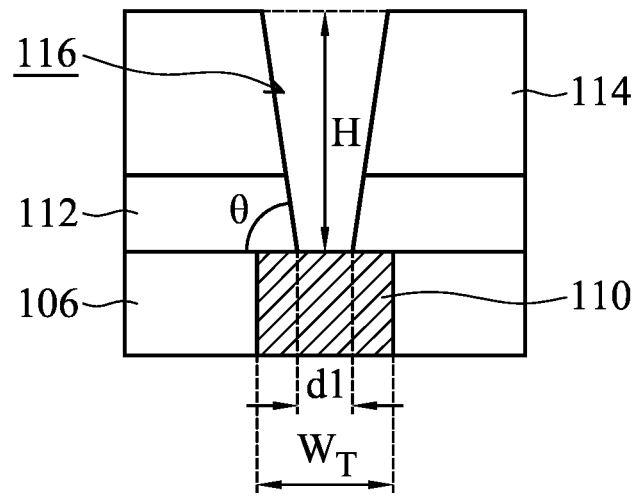
FIGS. 2A-2D are cross-sectional views of various stages of a process for forming a semiconductor device structure, in accordance with some embodiments.

As shown in FIG. 2A, the conductive structure 110 has a width $W_T$. The width $W_T$ may be in a range from about 3 nm to about 25 nm. In some embodiments, the via hole 116 has an inclined sidewall. As shown in FIGS. 1E and 2A, the inclined sidewall of the via hole 116 and the bottom surface of the etch stop layer 112 form an angle θ. The angle θ may be in a range from about 45 degrees to about 85 degrees. In some other embodiments, the via hole 116 has a substantially vertical sidewall. In these cases, the angle θ is substantially equal to about 90 degrees.

Figure 1F:
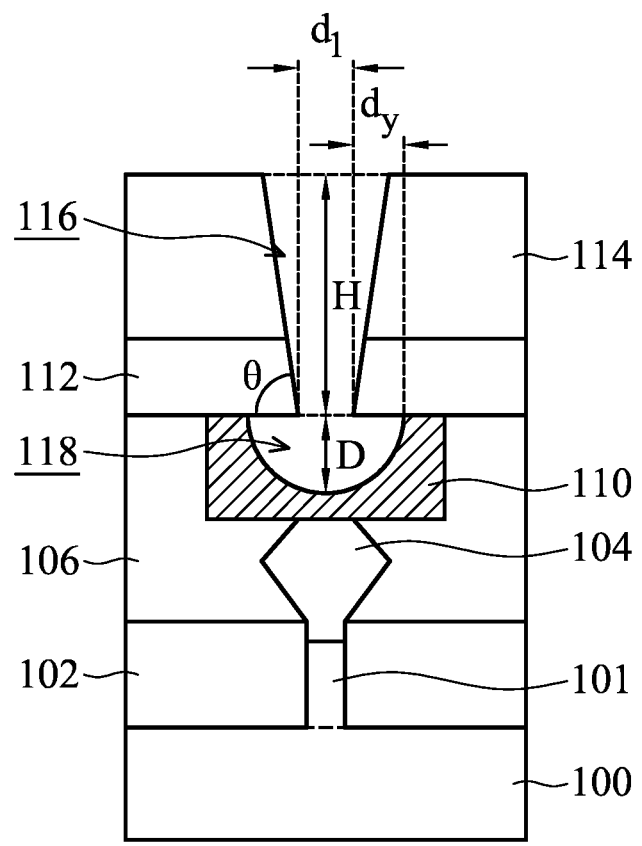
Figure 2B:
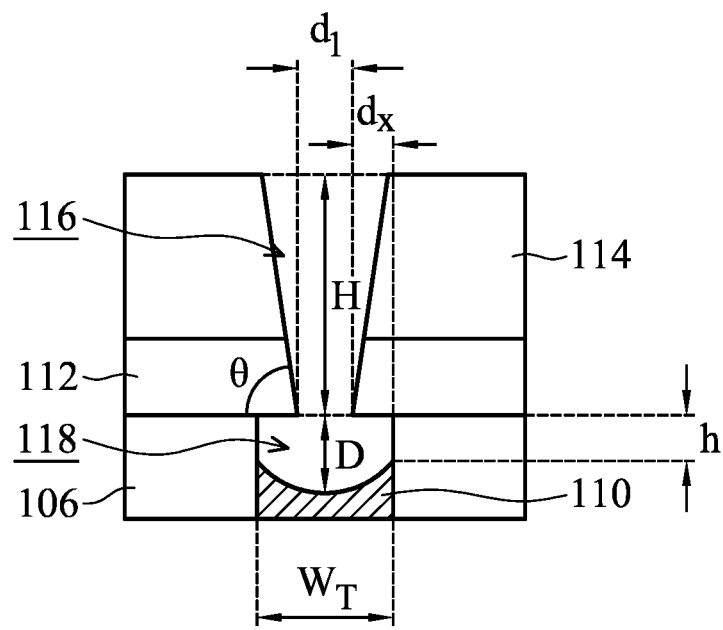

As shown in FIGS. 1F and 2B, the conductive structure 110 is partially removed through the via hole 116, in accordance with some embodiments. As a result, a recess 118 is formed in the conductive structure 110. An etching process (such as a wet etching process) is used to form the recess 118. In some embodiments, the recess 118 laterally extends beyond a bottom edge of the via hole 116, as shown in FIG. 1F. There is a distance $d_y$ between the bottom edge of the via hole 116 and the top edge of the recess 118. The distance $d_y$ may be in a range from about 1 nm to about 20 nm. However, in some other embodiments, the recess 118 does not laterally extend beyond the bottom edge of the via hole 116. In these cases, there is no distance between the bottom edge of the via hole 116 and the top edge of the recess 118.

As mentioned above, FIG. 2B shows the X-cut cross-sectional view of the structure shown in FIG. 1F, in accordance with some embodiments. In some embodiments, the recess 118 laterally extends beyond the bottom edge of the via hole 116. In some embodiments, the recess 118 extends laterally to partially expose the dielectric layer 106, as shown in FIG. 2B. The exposed portion of the dielectric layer 106 has a height h. The height h may be in a range from about 1 nm to about 30 nm. However, in some other embodiments, the recess 118 does not extend to reach the dielectric layer 106. In these cases, the dielectric layer 106 is not exposed by the recess 118.

There is a distance $d_x$ between the bottom edge of the via hole 116 and the top edge of the recess 118, as shown in FIG. 2B. The distance $d_x$ may be in a range from about 1 nm to about 11 nm. However, in some other embodiments, the recess 118 does not laterally extend beyond the bottom edge of the via hole 116. In these cases, there is no distance between the bottom edge of the via hole 116 and the top edge of the recess 118. As shown in FIGS. 1F and 2B, the recess 118 has a depth D. The depth D may be in a range from about 3 nm to about 30 nm.

Figure 1G:
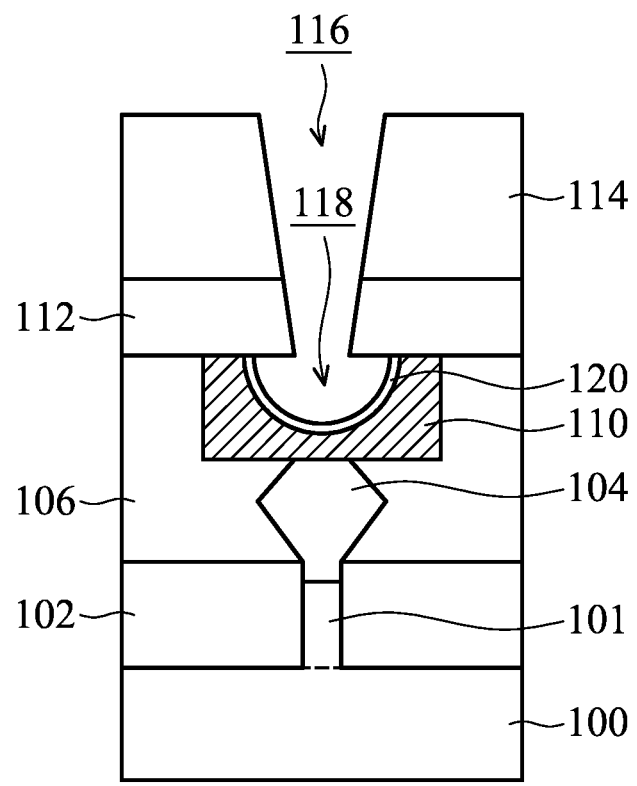
Figure 2C:
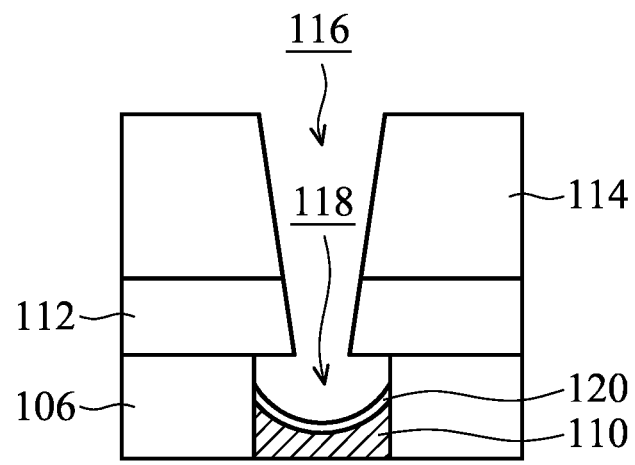

As shown in FIGS. 1G and 2C, an interfacial layer 120 is formed in the recess 118, in accordance with some embodiments. In some embodiments, the interfacial layer 120 is in direct contact with the conductive structure 110. The interfacial layer 120 may be used to prevent atomic diffusion between the conductive structure 110 and a subsequently formed conductive structure over the interfacial layer 120. In some embodiments, the interfacial layer 120 conformally extends along the sidewalls and the bottom of the recess 118. In some embodiments, the interfacial layer 120 has a substantially uniform thickness. The thickness of the interfacial layer 120 may be in a range from about 1 nm to about 20 nm.

In some embodiments, the interfacial layer 120 is made of or includes a conductive material that is different than the material of the conductive structure 110. The interfacial layer 120 may be made of or include tungsten (W), titanium (Ti), tantalum (Ta), ruthenium (Ru), cobalt (Co), molybdenum (Mo), aluminum (Al), one or more other suitable materials, or a combination thereof.

In some embodiments, the interfacial layer 120 is selectively deposited on the surfaces of the conductive structure 110 exposed by the recess 118. In some embodiments, the interfacial layer 120 does not extend along the sidewalls of the via hole 116, as shown in FIGS. 1G and 2C. The aspect ratio of the via hole 116 is not reduced after the formation of the interfacial layer 120. The interfacial layer 120 may be selectively deposited using a CVD process, an ALD process, an electrochemical plating process, one or more other applicable processes, or a combination thereof. For example, a tungsten-containing precursor may be used to form the interfacial layer 120 during a CVD process. The reaction gas mixture used in the CVD process may include $WF_6$ and hydrogen gas.

Figure 1H:
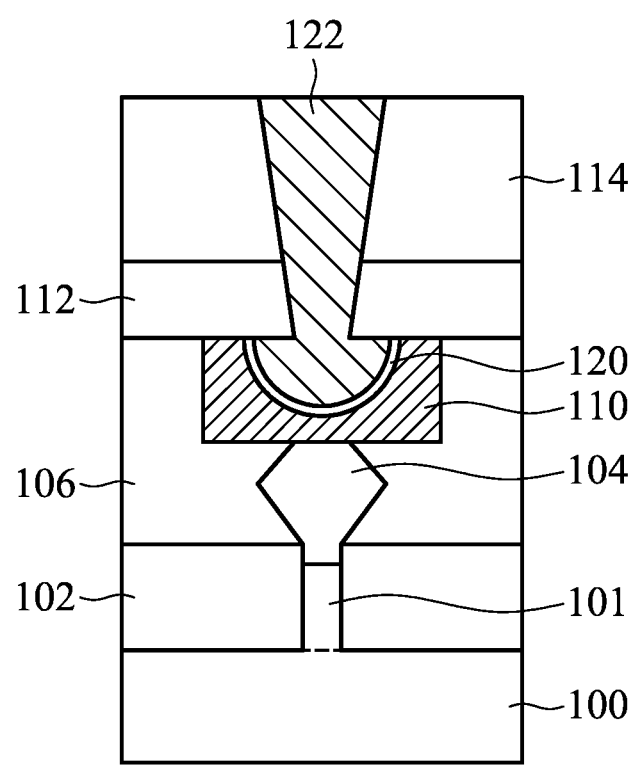
Figure 2D:
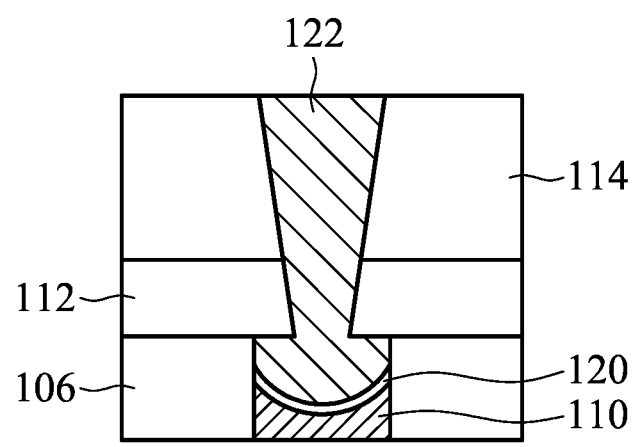

As shown in FIGS. 1H and 2D, a conductive structure 122 is formed to fill the recess 118 and the via hole 116, in accordance with some embodiments. The conductive structure 122 may function as a conductive via providing electrical connection to the conductive structure 110. In some embodiments, the conductive structure 122 is made of a conductive material that is different than the material of the conductive structure 110. In some embodiments, the materials of the conductive structure 110, the interfacial layer 120, and the conductive structure 122 are different from each other. The conductive structure 122 may be made of or include ruthenium (Ru), cobalt (Co), molybdenum (Mo), tungsten (W), aluminum (Al), or a combination thereof.

In some embodiments, a conductive material layer used for forming the conductive structure 122 is deposited over the dielectric layer 114 to overfill the recess 118 and the via hole 116. The conductive material layer may be deposited using a CVD process, an ALD process, a PVD process, an electrochemical plating process, one or more other applicable processes, or a combination thereof. For example, a ruthenium-containing gas may be used to deposit a ruthenium-containing material on the interfacial layer 120 using a CVD process. The ruthenium-containing gas may include $Ru_3CO_{12}$. The deposition temperature may be in a range from about 100 degrees C. to about 200 degrees C.

Afterwards, a planarization process may be used to remove the portion of the conductive material layer outside of the opening 108. The planarization process may include a CMP process, an etching process, a grinding process, a dry polishing process, one or more other applicable processes, or a combination thereof. As a result, the remaining portion of the conductive material layer in the recess 118 and the via hole 116 forms the conductive structure 122.

In some embodiments, the interfacial layer 120 and the conductive material layer used for forming the conductive structure 122 are formed in-situ in the same process chamber without breaking the vacuum before the conductive material layer used for forming the conductive structure 122 is formed. Since the semiconductor device structure is not taken out from the process chamber, the surface quality of the interfacial layer 120 is ensured. The interface quality between the conductive structure 122 and the interfacial layer 120 is improved. The corresponding conductivity are greatly improved.

In some embodiments, no additional barrier layer is formed before the formation of the conductive structure 122. As a result, the conductive structure 122 is in direct contact with the dielectric layer 114. In some embodiments, the conductive structure 122 is in direct contact with the etch stop layer 112. In some embodiments, the conductive structure 122 is in direct contact with the interfacial layer 120. In some embodiments, the conductive structure 122 is in direct contact with the dielectric layer 106, as shown in FIG. 2D. In some embodiments, the interfacial layer 120 is in direct contact with the dielectric layer 106, as shown in FIG. 2D. Since no additional layer is formed, the aspect ratio of the via hole 116 is prevented from being increased, the formation of the conductive structure may become easier to perform.

Since no additional barrier layer (which has high resistance) is formed, the conductivity between the conductive structures 122 and 110 may be maintained at a high level. In some embodiments, the interfacial layer 120 physically separates the conductive structures 110 and 122 from each other. The interfacial layer 120 may be used to prevent metal interaction between the conductive structures 110 and 122. The quality and reliability of the conductive structures 110 and 122 may therefore be ensured.

In some embodiments, the conductive structure 122 is partially surrounded by the dielectric layer 114 and partially surrounded by the conductive structure 110. As shown in FIGS. 1H and 2D, the conductive structure 122 has a first portion and a second portion. The first portion penetrates through the dielectric layer 114, and the second portion extends into the conductive structure 110. In some embodiments, the top of the second portion of the conductive structure 122 is wider than the bottom of the first portion of the conductive structure 122. The second portion of the conductive structure 122 greatly increases the contact area. As a result, the electrical connection between the conductive structures 110 and 122 is significantly improved.

In some embodiments, the conductive structure 110 is a conductive contact electrically connected to an epitaxial structure 104. However, embodiments of the disclosure are not limited thereto. Many variations and/or modifications can be made to embodiments of the disclosure. In some other embodiments, the processes illustrated in FIGS. 1 and 2 are used to form a conductive line and a conductive via that may not be directly connected to an epitaxial structure.

Figure 3:
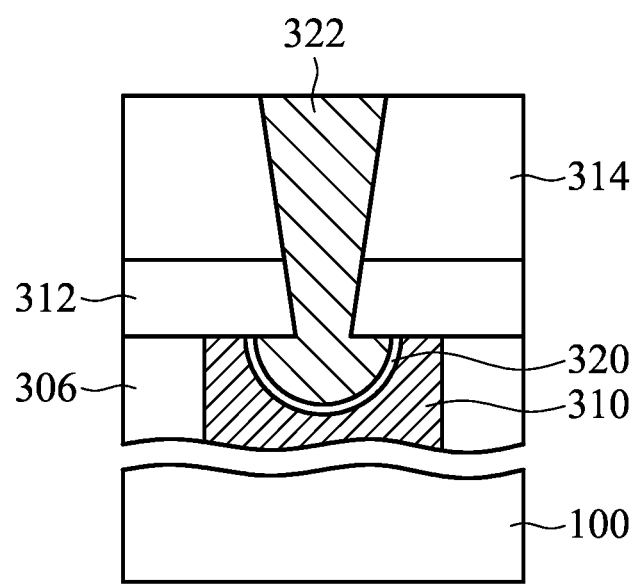
FIG. 3 is a cross-sectional view of a semiconductor device structure, in accordance with some embodiments.

FIG. 3 is a cross-sectional view of a semiconductor device structure, in accordance with some embodiments. In FIG. 3, some elements are omitted for simplicity and clarity. In some embodiments, a conductive structure 310 surrounded by a dielectric layer 306 are formed over the semiconductor substrate. In some embodiments, the conductive structure 310 is a conductive line that is not directly connected to an epitaxial structure. Afterwards, similar to the processes illustrated in FIGS. 1D-1H and 2A-2D, an etch stop layer 312, a dielectric layer 314, an interfacial layer 320, and a conductive structure 322 are formed, in accordance with some embodiments. The quality and reliability of the conductive structures 322 and 310 are improved.

In some embodiments, the interfacial layer between the conductive structures has a substantially uniform thickness. However, embodiments of the disclosure are not limited thereto. Many variations and/or modifications can be made to embodiments of the disclosure.

Figure 4A:
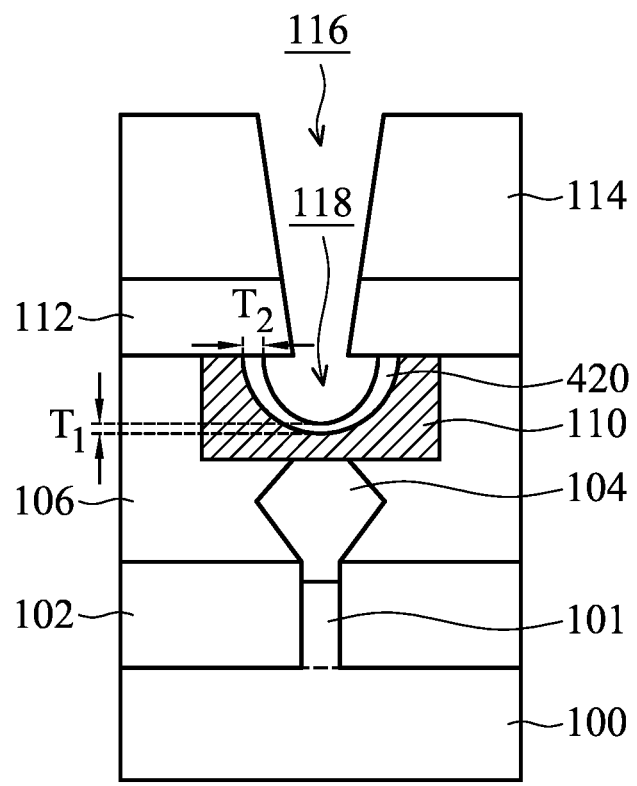
FIGS. 4A-4B are cross-sectional views of various stages of a process for forming a semiconductor device structure, in accordance with some embodiments.
Figure 4B:
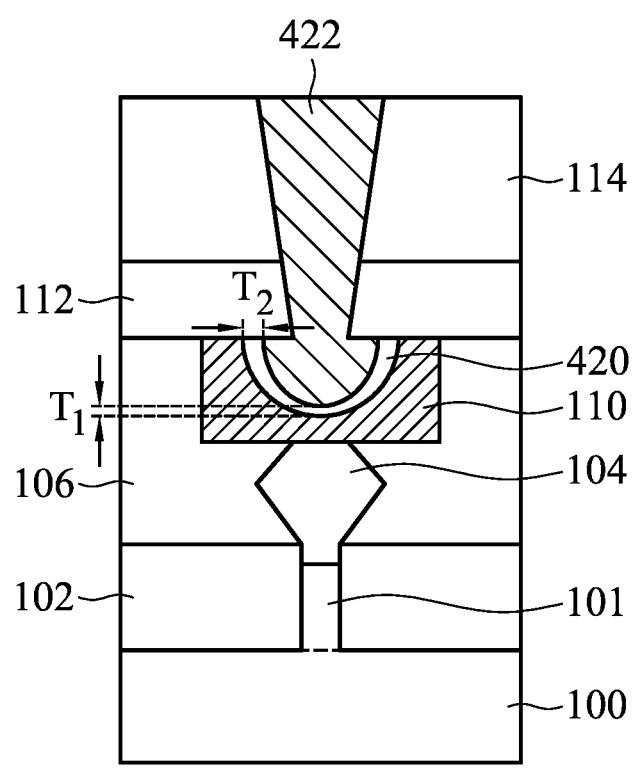

FIGS. 4A-4B are cross-sectional views of various stages of a process for forming a semiconductor device structure, in accordance with some embodiments. As shown in FIG. 4A, a structure similar to the structure shown in FIG. 1F is formed or received. In some embodiments, an interfacial layer 420 is formed, as shown in FIG. 4A. The material and formation method of the interfacial layer 420 may be similar to those of the interfacial layer 120. In some embodiments, the profile of the interfacial layer 420 may be fine-tuned by adjusting the deposition parameter for forming the interfacial layer 420. In some embodiments, the thicknesses of the interfacial layer 420 at different positions are not uniform. In some embodiments, the interfacial layer 420 has an upper portion with a thickness $T_2$ and a lower portion with a thickness $T_1$, as shown in FIG. 4A. In some embodiments, the upper portion of the interfacial layer 420 is thicker than the lower portion of the interfacial layer 420.

As shown in FIG. 4B, a conductive structure 422 is formed over the interfacial layer 420 to fill the recess 118 and the via hole 116, in accordance with some embodiments. The material and formation method of the conductive structure 422 may be the same as or similar to those of the conductive structure 122 illustrated in FIGS. 1 and 2.

In some embodiments, the recess 118 has curved sidewalls. However, embodiments of the disclosure are not limited thereto. Many variations and/or modifications can be made to embodiments of the disclosure. In some other embodiments, the recess 118 is formed to have an undulating profile.

Figure 5A:
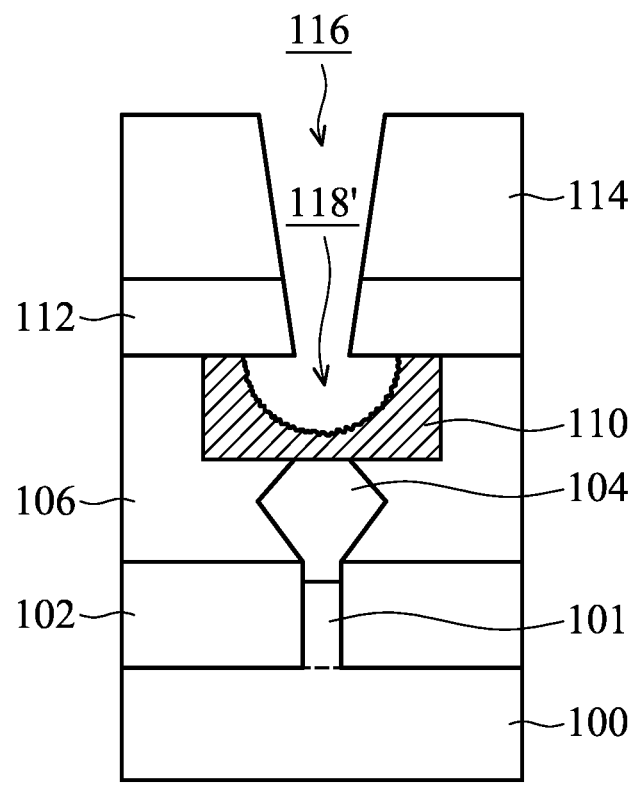
FIGS. 5A-5B are cross-sectional views of various stages of a process for forming a semiconductor device structure, in accordance with some embodiments.
Figure 5B:
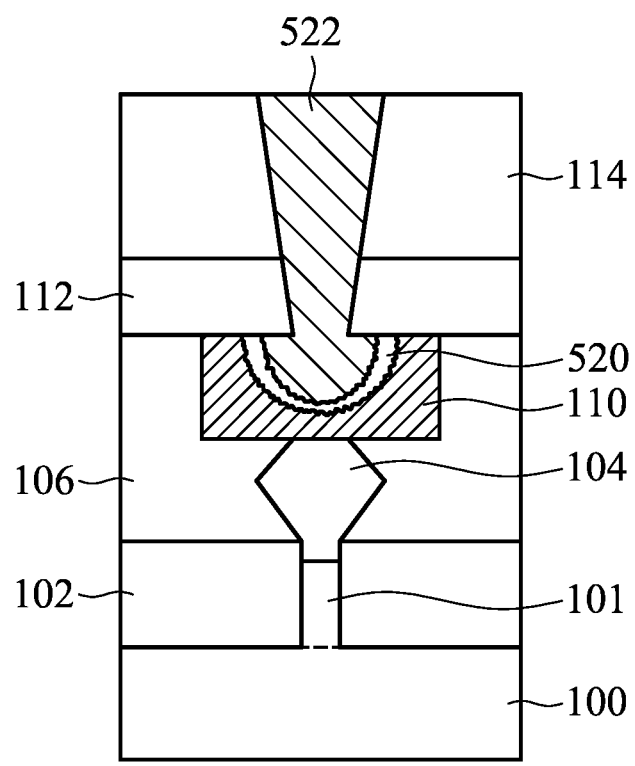

FIGS. 5A-5B are cross-sectional views of various stages of a process for forming a semiconductor device structure, in accordance with some embodiments. In some embodiments, by fine-tuning the etching process, a recess 118' with an undulating profile is formed.

Afterwards, processes similar to those illustrated in FIGS. 1G-1H are performed, as shown in FIG. 5B in accordance with some embodiments. As a result, an interfacial layer 520 and a conductive structure 522 are formed. The material and formation method of the interfacial layer 520 may be the same as or similar to those of the interfacial layer 120. The material and formation method of the conductive structure 522 may be the same as or similar to those of the conductive structure 122. In some embodiments, the interfacial layer 520 also has an undulating profile, as shown in FIG. 5B.

Embodiments of the disclosure provide structures and formation methods of a semiconductor device with stacked conductive structures. An underlying conductive structure (such as a conductive contact or a conductive line) is recessed before an overlying conductive structure (such as a conductive via) is formed thereon. The contact area between the stacked conductive structures is increased. An interfacial layer is formed between the stacked conductive structures to prevent the metals from interacting. The quality and reliability of the conductive structures are ensured. Therefore, device performance and reliability are significantly improved.

In accordance with some embodiments, a method for forming a semiconductor device structure is provided. The method includes forming a first conductive structure over a semiconductor substrate and forming a dielectric layer over the first conductive structure. The method also includes forming a via hole in the dielectric layer to partially expose the first conductive structure. The method further includes partially removing the first conductive structure through the via hole to form a recess in the first conductive structure. In addition, the method includes forming an interfacial layer in the recess. The interfacial layer is in direct contact with the first conductive structure. The method further includes forming a second conductive structure to fill the recess and the via hole.

In accordance with some embodiments, a semiconductor device structure is provided. The semiconductor device structure includes a semiconductor substrate and a first conductive structure over the semiconductor substrate. The semiconductor device structure also includes a first dielectric layer surrounding the first conductive structure and a second dielectric layer over the first dielectric layer. The semiconductor device structure further includes a second conductive structure having a first portion and a second portion. The first portion penetrates through the second dielectric layer, and the second portion extends into the first conductive structure. In addition, the semiconductor device structure includes an interfacial layer between the first conductive structure and the second conductive structure.

In accordance with some embodiments, a semiconductor device structure is provided. The semiconductor device structure includes a semiconductor substrate and a first conductive structure over the semiconductor substrate. The semiconductor device structure also includes a first dielectric layer surrounding the first conductive structure and a second dielectric layer over the first dielectric layer. The semiconductor device structure further includes a second conductive structure partially surrounded by the second dielectric layer and partially surrounded by the first conductive structure. In addition, the semiconductor device structure includes an interfacial layer separating the first conductive structure from the second conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a source/drain structure over a semiconductor substrate;
    forming a first conductive structure over the source/drain structure;
    forming a dielectric layer over the first conductive structure;
    forming a via hole in the dielectric layer to partially expose the first conductive structure;
    partially removing the first conductive structure through the via hole to form a recess in the first conductive structure, wherein the recess has a width that is greater than a bottom width of the via hole;
    forming an interfacial layer in the recess, wherein the interfacial layer is in direct contact with the first conductive structure, and an entirety of the first conductive structure is below the interfacial layer; and
    forming a second conductive structure to fill the recess and the via hole, wherein the interfacial layer and the second conductive structure are formed in-situ in a same process chamber without breaking vacuum before the second conductive structure is formed.

2. The method for forming a semiconductor device structure as claimed in claim 1, wherein the second conductive structure is formed to be in direct contact with the interfacial layer and the dielectric layer.

3. The method for forming a semiconductor device structure as claimed in claim 1, wherein the interfacial layer is selectively deposited on a surface of the first conductive structure exposed by the recess, and the interfacial layer does not extend along a sidewall of the via hole.

4. The method for forming a semiconductor device structure as claimed in claim 1, wherein the first conductive structure, the interfacial layer, and the second conductive structure are made of different materials.

5. The method for forming a semiconductor device structure as claimed in claim 1, further comprising forming a second dielectric layer over the semiconductor substrate before the dielectric layer is formed, wherein the second dielectric layer surrounds the first conductive structure.

6. The method for forming a semiconductor device structure as claimed in claim 5, wherein the recess partially exposes the second dielectric layer before the second conductive structure is formed.

7. The method for forming a semiconductor device structure as claimed in claim 6, wherein the second conductive structure is in direct contact with the second dielectric layer.

8. The method for forming a semiconductor device structure as claimed in claim 5, further comprising forming an etch stop layer over the second dielectric layer and the first conductive structure before the dielectric layer is formed.

9. The method for forming a semiconductor device structure as claimed in claim 1, wherein an entirety of the interfacial layer is below a bottommost surface of the dielectric layer.

10. The method for forming a semiconductor device structure as claimed in claim 1, wherein the first conductive structure comprises a metal material.

11. A method for forming a semiconductor device structure, comprising:
    forming a first conductive structure surrounded by a first dielectric layer;
    forming a second dielectric layer over the first conductive structure and the first dielectric layer;
    forming a via hole in the second dielectric layer, wherein the via hole exposes the first conductive structure while the first dielectric layer is covered by the second dielectric layer;
    partially removing the first conductive structure through the via hole to form a recess in the first conductive structure;
    forming an interfacial layer in the recess, wherein the interfacial layer is in direct contact with the first conductive structure;
    forming a second conductive structure filling the recess and the via hole, wherein the second conductive structure is in direct contact with the first dielectric layer; and
    forming an etch stop layer over the first dielectric layer and the first conductive structure before the second dielectric layer is formed, wherein the recess exposes a lower surface of the etch stop layer after the formation of the interfacial layer and before the formation of the second conductive structure.

12. The method for forming a semiconductor device structure as claimed in claim 11, wherein the recess exposes a sidewall of the first dielectric layer.

13. The method for forming a semiconductor device structure as claimed in claim 11, wherein the second conductive structure has a first portion and a second portion, the first portion penetrates through the second dielectric layer, the second portion extends into the first conductive structure, a top of the second portion of the second conductive structure is wider than a bottom of the first portion of the second conductive structure.

14. The method for forming a semiconductor device structure as claimed in claim 11, wherein the interfacial layer and the second conductive structure are formed in-situ in a same process chamber.

15. The method for forming a semiconductor device structure as claimed in claim 11, wherein an entirety of the interfacial layer is below a bottommost surface of the second dielectric layer.

16. A method for forming a semiconductor device structure, comprising:
    forming a first conductive structure surrounded by a first dielectric layer, wherein the first conductive structure comprises cobalt, ruthenium, tungsten, molybdenum, aluminum, or a combination thereof;
    forming a second dielectric layer over the first conductive structure and the first dielectric layer;

forming a via hole in the second dielectric layer, wherein the via hole exposes the first conductive structure;

partially removing the first conductive structure through the via hole to form a recess in the first conductive structure;

forming a second conductive structure filling the recess and the via hole, wherein the second conductive structure is in direct contact with the first dielectric layer; and forming an interfacial layer directly on the first conductive structure before the formation of the second conductive structure.

17. The method for forming a semiconductor device structure as claimed in claim 16, wherein the interfacial layer is in direct contact with the first dielectric layer and the second conductive structure.

18. The method for forming a semiconductor device structure as claimed in claim 16, wherein the interfacial layer is selectively formed on the first conductive structure, and the interfacial layer does not extend along a sidewall of the via hole.

19. The method for forming a semiconductor device structure as claimed in claim 16 wherein the second conductive structure is physically separated from the first conductive structure by the interfacial layer.

20. The method for forming a semiconductor device structure as claimed in claim 16, wherein a topmost surface of the interfacial layer is located vertically between a bottommost surface of the second conductive structure and the second dielectric layer.

* * * * *